(12) United States Patent
Peng

(10) Patent No.: US 11,373,866 B2
(45) Date of Patent: Jun. 28, 2022

(54) DIELECTRIC MATERIAL AND METHODS OF FORMING SAME

(71) Applicant: Taiwan Semiconductor Manufacturing Co., Ltd., Hsinchu (TW)

(72) Inventor: Yu-Yun Peng, Hsinchu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 51 days.

(21) Appl. No.: 16/396,558

(22) Filed: Apr. 26, 2019

(65) Prior Publication Data

US 2020/0006072 A1 Jan. 2, 2020

Related U.S. Application Data

(60) Provisional application No. 62/692,462, filed on Jun. 29, 2018.

(51) Int. Cl.
| | | |
|---|---|---|
| *H01L 21/033* | (2006.01) | |
| *H01L 21/02* | (2006.01) | |
| *H01L 21/321* | (2006.01) | |
| *H01L 21/762* | (2006.01) | |

(52) U.S. Cl.
CPC .... *H01L 21/0337* (2013.01); *H01L 21/02126* (2013.01); *H01L 21/02211* (2013.01); *H01L 21/02274* (2013.01); *H01L 21/3212* (2013.01); *H01L 21/76224* (2013.01)

(58) Field of Classification Search
CPC .......... H01L 21/0337; H01L 21/02274; H01L 21/3212; H01L 21/02126; H01L 21/76224; H01L 21/02211
See application file for complete search history.

(56) References Cited

U.S. PATENT DOCUMENTS

| | | | |
|---|---|---|---|
| 7,915,139 B1 | 3/2011 | Lang et al. | |
| 2011/0034039 A1 | 2/2011 | Liang et al. | |
| 2011/0210447 A1* | 9/2011 | Seidel | H01L 21/76808 257/774 |
| 2015/0162185 A1* | 6/2015 | Pore | H01L 21/02167 438/786 |
| 2017/0018452 A1 | 1/2017 | Dou et al. | |
| 2018/0286669 A1* | 10/2018 | Mallick | C23C 16/50 |
| 2018/0315598 A1* | 11/2018 | Li | H01L 21/02211 |
| 2019/0055645 A1* | 2/2019 | Li | H01L 21/02167 |
| 2019/0292658 A1* | 9/2019 | Li | C23C 16/50 |
| 2020/0066595 A1* | 2/2020 | Glass | H01L 27/1211 |

* cited by examiner

*Primary Examiner* — Binh X Tran

(74) *Attorney, Agent, or Firm* — Haynes and Boone, LLP

(57) ABSTRACT

Provided is a dielectric material composition and related methods. The method includes patterning a substrate to include a first feature, a second feature adjacent to the first feature, and a trench disposed between the first and second features. The method further includes depositing a dielectric material over the first feature and within the trench. In some embodiments, the depositing the dielectric material includes flowing a first precursor, a second precursor, and a reactant gas into a process chamber. Further, while flowing the first precursor, the second precursor, and the reactant gas into the process chamber, a plasma is formed within the process chamber to deposit the dielectric material.

20 Claims, 11 Drawing Sheets

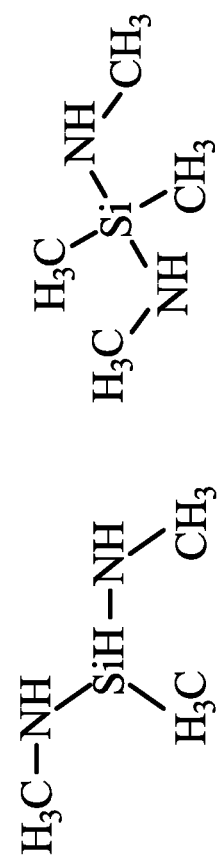
FIG. 13
FIG. 14
FIG. 15
FIG. 16
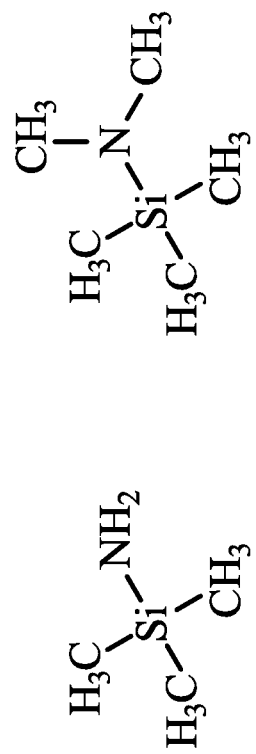
FIG. 17
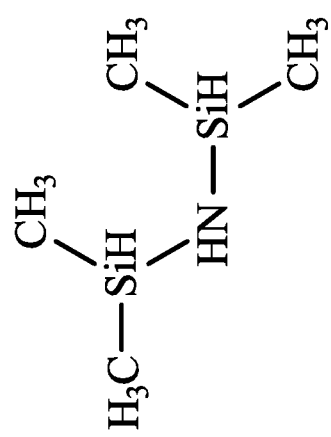
FIG. 18
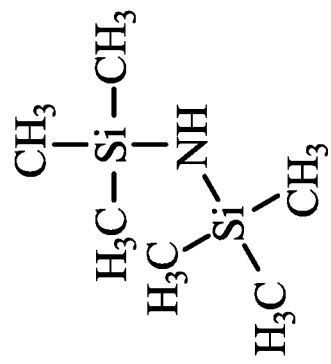

DIELECTRIC MATERIAL AND METHODS OF FORMING SAME

CROSS-REFERENCE TO RELATED APPLICATION

This application claims the benefit of U.S. Provisional Application No. 62/692,462, filed Jun. 29, 2018, the entirety of which is incorporated by reference herein.

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

As scaling down of IC dimensions continues, it is often necessary in semiconductor processing to fill high aspect ratio gaps (e.g., with insulating material). Such a process may be referred to as a "gap-filling" or "gap-fill" process. By way of example, gap-fill processes may be used for shallow trench isolation (STI), inter-metal dielectric layers, passivation layers, hard mask layers, or other types of layers. In at least some existing processes, a poor material filling process (e.g., a poor gap-fill process) may cause gaps or voids (e.g., in a metal gate, in a trench, or elsewhere), thereby detrimentally impacting device performance. To mitigate gap-fill issues, flowable chemical vapor deposition (FCVD) processes have been introduced. While FCVD deposited oxide has excellent flowability, it also has poor chemical resistance (e.g., to etching processes). In addition, at least some chemical elements currently used as FCVD precursors possess a large stereochemical structure, which is unfavorable for gap-fill applications.

Thus, existing techniques have not proved entirely satisfactory in all respects.

BRIEF DESCRIPTION OF THE DRAWINGS

Aspects of the present disclosure are best understood from the following detailed description when they are read with the accompanying figures. It is noted that, in accordance with the standard practice in the industry, various features are not drawn to scale. In fact, the dimensions of the various features may be arbitrarily increased or reduced for clarity of discussion.

FIGS. 6, 7, and 8 illustrate exemplary Si precursors, according to some embodiments;

FIGS. 9, 10, 11, 12, 13, 14, 15, 16, 17, and 18 illustrate exemplary C precursors, according to some embodiments;

DETAILED DESCRIPTION

Figure 1:
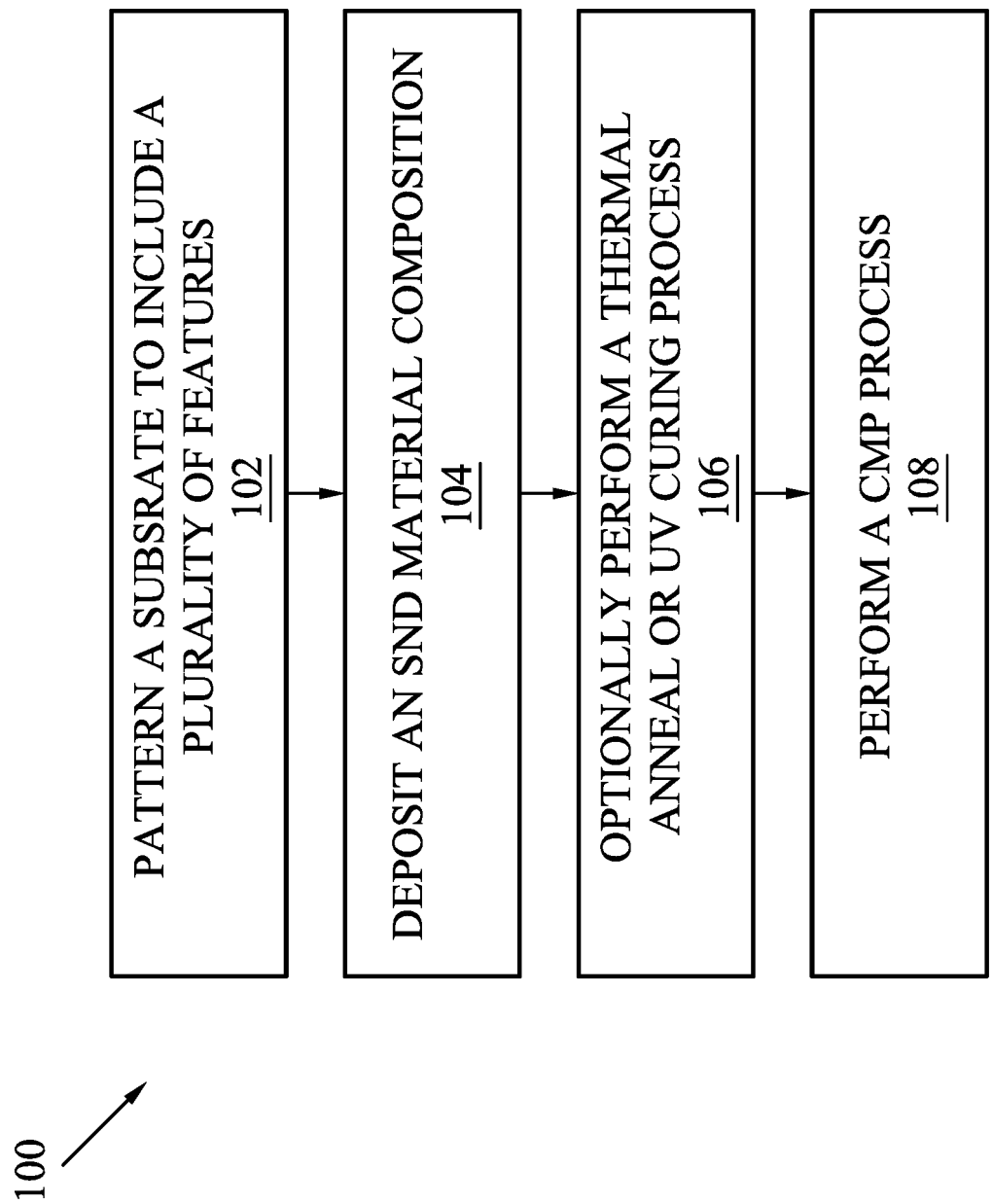
FIG. 1 shows a flow chart of a method for utilizing a synthetic nanofill dielectric (SND) as a gap-fill material, according to various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is also noted that the embodiments described herein may be employed in the design and/or fabrication of any type of integrated circuit, or portion thereof, which may comprise any of a plurality of various devices and/or components such as a static random access memory (SRAM) and/or other logic circuits, passive components such as resistors, capacitors, and inductors, and active components such as P-channel field-effect transistors (PFETs), N-channel FETs (NFETs), metal-oxide-semiconductor field-effect transistors (MOSFETs), complementary metal-oxide-semiconductor (CMOS) transistors, bipolar transistors, high voltage transistors, high frequency transistors, FinFET devices, gate-all-around (GAA) devices, Omega-gate (Ω-gate) devices, or Pi-gate (Π-gate) devices, as well as strained-semiconductor devices, silicon-on-insulator (SOI) devices, partially-depleted SOI (PD-SOI) devices, fully-depleted SOI (FD-SOI) devices, other memory cells, or other devices as known in the art. One of ordinary skill may recognize other embodiments of semiconductor devices and/or circuits, including the design and fabrication thereof, which may benefit from aspects of the present disclosure.

In semiconductor processing, it is often necessary to fill high aspect ratio gaps (e.g., with insulating material) using a gap-fill process. In various embodiments, gap-fill processes may be used for STI, inter-metal dielectric layers, passivation layers, hard mask layers, or other types of layers. Moreover, a poor gap-fill process may cause gaps or voids (e.g., in a metal gate, in a trench, or elsewhere), thereby detrimentally impacting device performance. Flowable chemical vapor deposition (FCVD) processes have been introduced in an attempt to mitigate such issues. However, while FCVD deposited oxide has excellent flowability, it also has poor chemical resistance (e.g., to etching processes). Further, at least some chemical elements currently used as FCVD precursors possess a large stereochemical structure, which is unfavorable for gap-fill applications. Thus, existing techniques have not proved entirely satisfactory in all respects.

Embodiments of the present disclosure offer advantages over the existing art, though it is understood that other embodiments may offer different advantages, not all advantages are necessarily discussed herein, and no particular advantage is required for all embodiments. For example, embodiments discussed herein include a dielectric material composition and related methods that effectively mitigate shortcomings of at least some existing methods. In some embodiments, a synthetic nanofill dielectric (SND) is employed to form a dielectric layer (e.g., an isolation structure). In some examples, the SND may be used as a gap-fill material, as a hard mask material, or generally as a dielectric material layer. In some embodiments, the SND material may be formed using a CVD chamber equipped with a rotary susceptor and a plasma module. In some embodiments, formation of the SND material includes use of one or two precursors, where one precursor is used as a Si and/or C source, and where the other precursor is used as an extra C source for carbon content modulation. In some embodiments, at least one of the precursors used to form the SND material includes Si. Generally, in various embodiments, the present disclosure provides for the formation of a carbon-containing nanofill material with excellent flowability and chemical selectivity by synthetic conjugation of Si—C—Si units into a network with an —O— or —N— bridge. As such, chemical selectivity by modulation of carbon content and the backbone category is provided, application of dendri-molecules for fair flowability is provided, and a facility for producing a ternary or quaternary dielectric material with moderate flowability is provided. Other embodiments and advantages will be evident to those skilled in the art upon reading the present disclosure.

In addition, it is noted that the dielectric material compositions and methods of the present disclosure are not limited to a particular substrate type, mask type, photoresist type, radiation source (e.g., radiation wavelength), and/or photolithography system type. For example, the material compositions and methods may be applied to features and/or devices patterned on a variety of substrate materials such as silicon, germanium, silicon carbide (SiC), silicon germanium (SiGe), diamond, compound semiconductors, alloy semiconductors, and the substrate may optionally include one or more epitaxial layers (epi-layers), may be strained for performance enhancement, may include a silicon-on-insulator (SOI) structure, and/or have other suitable enhancement features. Embodiments of the present disclosure may further be applicable to processes employing reflective masks (e.g., such as used for extreme ultraviolet (EUV) lithography), transmissive masks, binary intensity masks, phase-shifting masks, as well as other mask types known in the art. In some examples, embodiments disclosed herein may be applied to processes employing various types of photoresist such as poly(methyl methacrylate) (PMMA), SU-8, an EUV resist, a positive-tone resist, a negative-tone resist, or other types of resist as known in the art. Additionally, embodiments of the present disclosure are applicable to various photolithography system/aligner types such as a contact aligner, a proximity aligner, a projection aligner, or an EUV lithography system. Thus, embodiments of the present disclosure may further be applicable to systems employing any of a variety of radiation sources (radiation wavelengths) such as UV light, deep UV (DUV) light, EUV light, or other radiation sources as known in the art.

Referring now to the example of FIG. 1, illustrated therein is a flow chart of a method 100 for utilizing an SND as a gap-fill material, according to various embodiments. It is understood that additional operations can be provided before, during, and after the method 100, and some operations described can be replaced, eliminated, or moved around for additional embodiments of the method. It is also noted that the method 100 is exemplary, and is not intended to limit the present disclosure beyond what is explicitly recited in the claims that follow. The method 100 will be further described below in conjunction with FIGS. 2A and 2B.

The method 100 begins at block 102 where a substrate is patterned to include a plurality of features. With reference to the example of FIG. 2A, in an embodiment of block 102, illustrated therein is a cross-section view of a device 200 including a substrate 202 having a plurality of features 204 formed onto the substrate 202. In some embodiments, the substrate 202 may include one or more of a plurality of substrate materials (e.g., Si, Ge, SiC, SiGe, compound semiconductors, etc.), may include one or more epi-layers, may include conductive or insulating layers formed on the substrate 202, and/or may include various enhancement features, as described above. The substrate 202 may also include various doping configurations depending on design requirements as is known in the art.

Figure 2A:
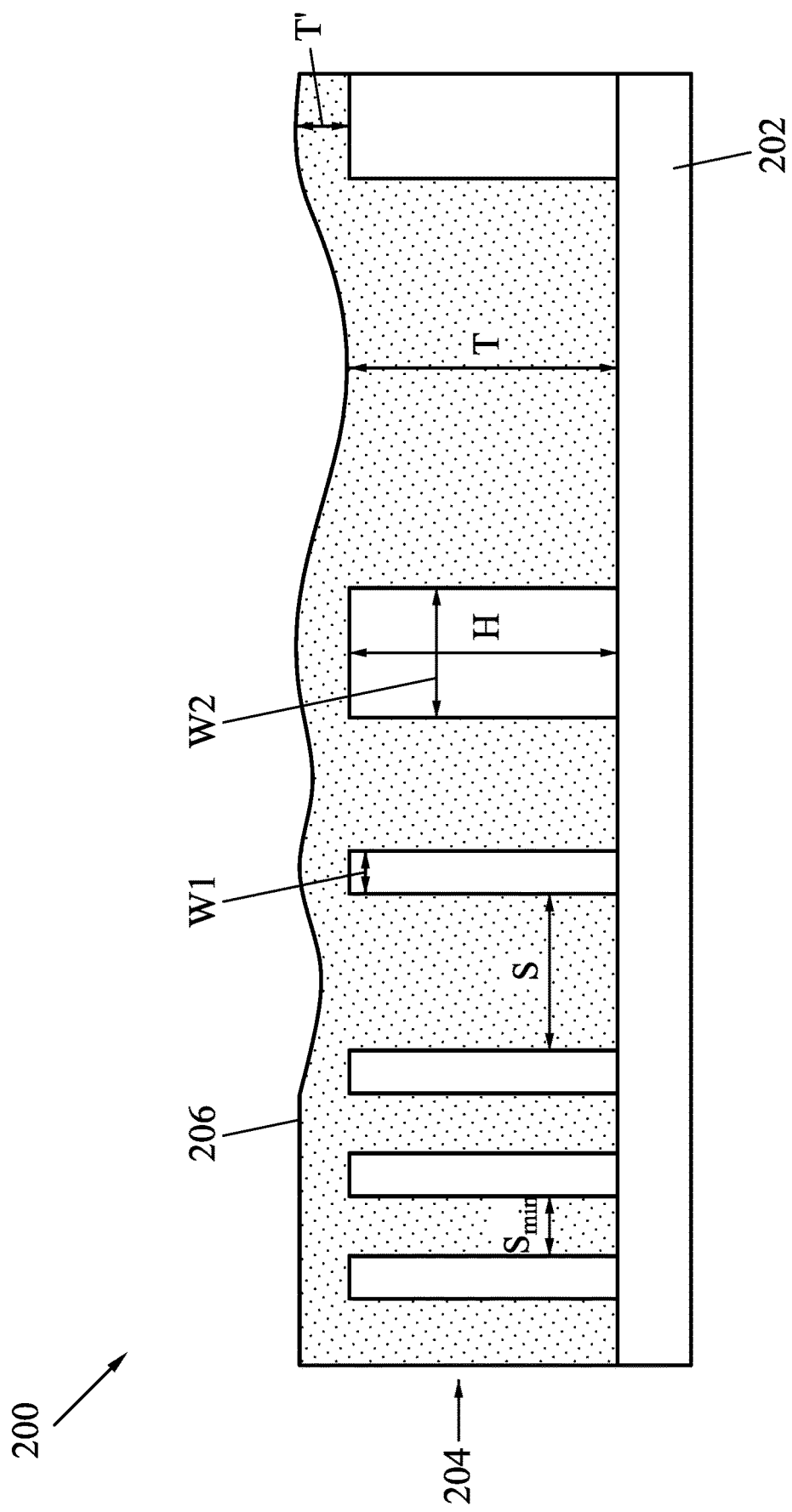
FIG. 2A illustrates a cross-section view of a device having a plurality of features and an SND formed using the method of FIG. 1, according to some embodiments.

Additionally, in various embodiments, the features 204 of FIG. 2A may correspond to metal layers, oxide layers, nitride layers, semiconductor layers, or other layers that makes up a component of a fabricated IC device. In some examples, the features 204 may be combined with other features to form various portions of an IC device and/or circuit. In some embodiments, the features 204 may include various features known in the art which may be formed and/or deposited on the substrate 202. For instance, in some embodiments, the features 204 may include features composed of materials such as Si, SiGe, Si-based dielectrics, metal oxides, metal nitrides, metals, or other materials, and may include simple or complex structures such as fin structures used in the formation of fin field-effect transistors (FinFETs), or other structures.

In various embodiments, and as shown in FIG. 2A, the plurality of features 204 may have a variety of widths (e.g., 'W1', 'W2', etc.) and a height 'H'. A spacing between adjacent features is indicated as 'S', while a minimum feature spacing is indicated as 'Smin'. In various embodiments, and prior to deposition of the SND material composition, the plurality of features 204 formed on the substrate 202 may define a plurality of trenches or hole structures (e.g., between adjacent features) having varying widths defined at least in part by the spacing 'S' between adjacent features. In some embodiments, the spacing 'S' between adjacent features is greater than or equal to about 6 nm. In some cases, the width 'W1' or 'W2' is greater than or equal to about 6 nm. An aspect ratio (e.g., H/W1) may be defined which represents an aspect ratio of the trenches or hole structures (e.g., disposed between adjacent features). In some embodiments, the aspect ratio may be greater than or equal to about 8. Generally, in various examples, 'W1' or 'W2' may be greater than or equal to about 6 nm and less than or equal to about 50 nm; 'H' may be greater than or equal to about 48 nm and less than or equal to about 150 nm; and the aspect ratio 'H/W' (e.g., H/W1 or H/W2) may be greater than or equal to about 1 and less than or equal to about 18.

The method 100 proceeds to block 104 where the SND material composition is deposited over the plurality of features. Still referring to the example of FIG. 2A, in an embodiment of block 104, illustrated therein is a cross-section view of the device 200 including an SND material composition 206 deposited on the substrate 202 and over the plurality of features 204. As previously noted, the SND material composition 206 may be formed using a CVD chamber equipped with a rotary susceptor and a plasma module. Additional details regarding an exemplary system and method for depositing the SND material composition 206 are described below with reference to FIGS. 19 and 20. In some embodiments, a thickness (T) of the SND material composition 206 may be defined (e.g., within the trench or hole structures between adjacent features 204), and a thickness (T') may be defined (e.g., over one or more of the plurality of features 204 formed on the substrate 202). In some embodiments, T/T' is defined as a "flowability" of the SND material composition 206. As merely one example, T/T' may be greater than about 5 when the spacing 'S' between adjacent features is equal to about 100 nm. Increased flowability may provide for improved gap-fill processing.

Figure 5:
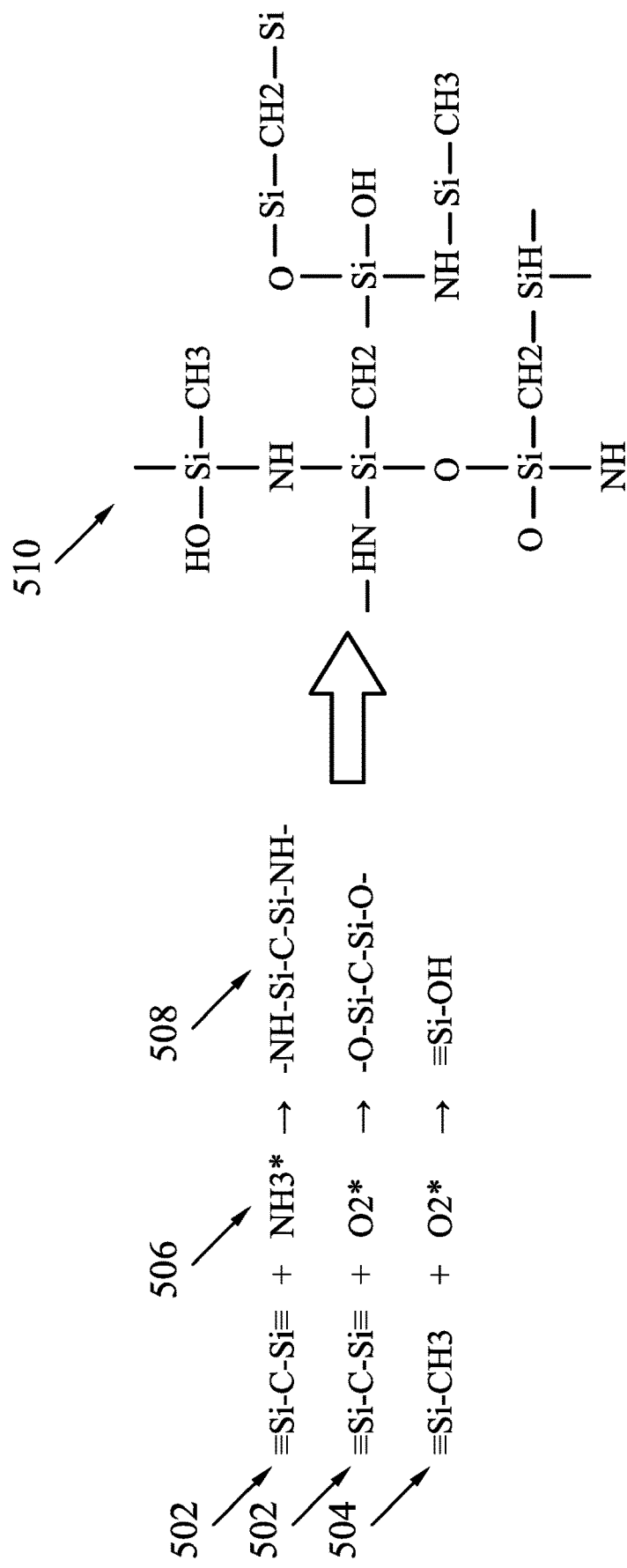
FIG. 5 illustrates an exemplary reaction used to form an SND, according to some embodiments.
Figures 6, 7, 8, 9, 10, 11, 12:
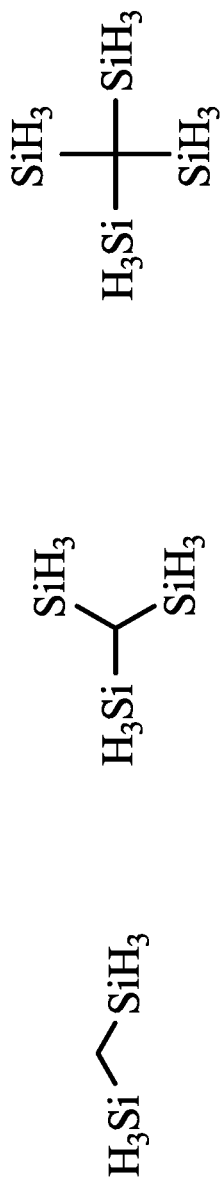

In some embodiments, formation of the SND material composition 206 (e.g., within the CVD chamber) may include the use of one or two precursors, where one precursor is used as a Si and/or C source, and where the other precursor is used as an extra C source for carbon content modulation. In some embodiments, at least one of the precursors used to form the SND material includes Si. In some examples, deposition of the SND material composition 206 may further include the use of $NH_3$, $N_2$, $NO$, $NO_2$, $O_2$, $CO_2$, and/or $H_2$ as reactant gases, where radicals may be formed under plasma ignition (e.g., within the CVD chamber). For example, a precursor with Si and/or C may react with N-radicals, O-radicals and/or H-radicals, such that the deposited SND material composition 206 has a composition such as SiCON, SiCN or SiCO by conjugating the individual elements, resulting in the SND material composition 206. As one example, and with reference to FIG. 5, the SND material composition 206 including SiCON may be fabricated as shown. For example, a Si-source 502 (e.g., Si precursor) having a Si—C—Si bond, a C-source 504 (e.g., C precursor) having a Si—$CH_3$ bond, may be reacted with an $NH_3$ or $O_2$ reactant gas 506 (e.g., in the CVD chamber), where the reactant gases become reactive radicals 508 (e.g., through an ICP plasma reactor). In some embodiments, the reactive radicals 508 may further react to form a SiCON SND material composition 510 having a Si—N—Si and a Si—O—Si network. Various additional features and/or embodiments of the SND material composition are described in more detail below with reference to FIGS. 6-18.

The method 100 proceeds to block 106 where a thermal anneal or UV curing process is optionally performed. In some cases, for example, a thermal anneal or UV curing process may be performed to the device 200 after deposition of SND material composition 206 for reduction of H content, bond cross-linking, and to increase a density of the SND material composition 206. In some embodiments, the thermal anneal or UV curing process may be performed at a temperature of about 300-450 C.

Figure 2B:
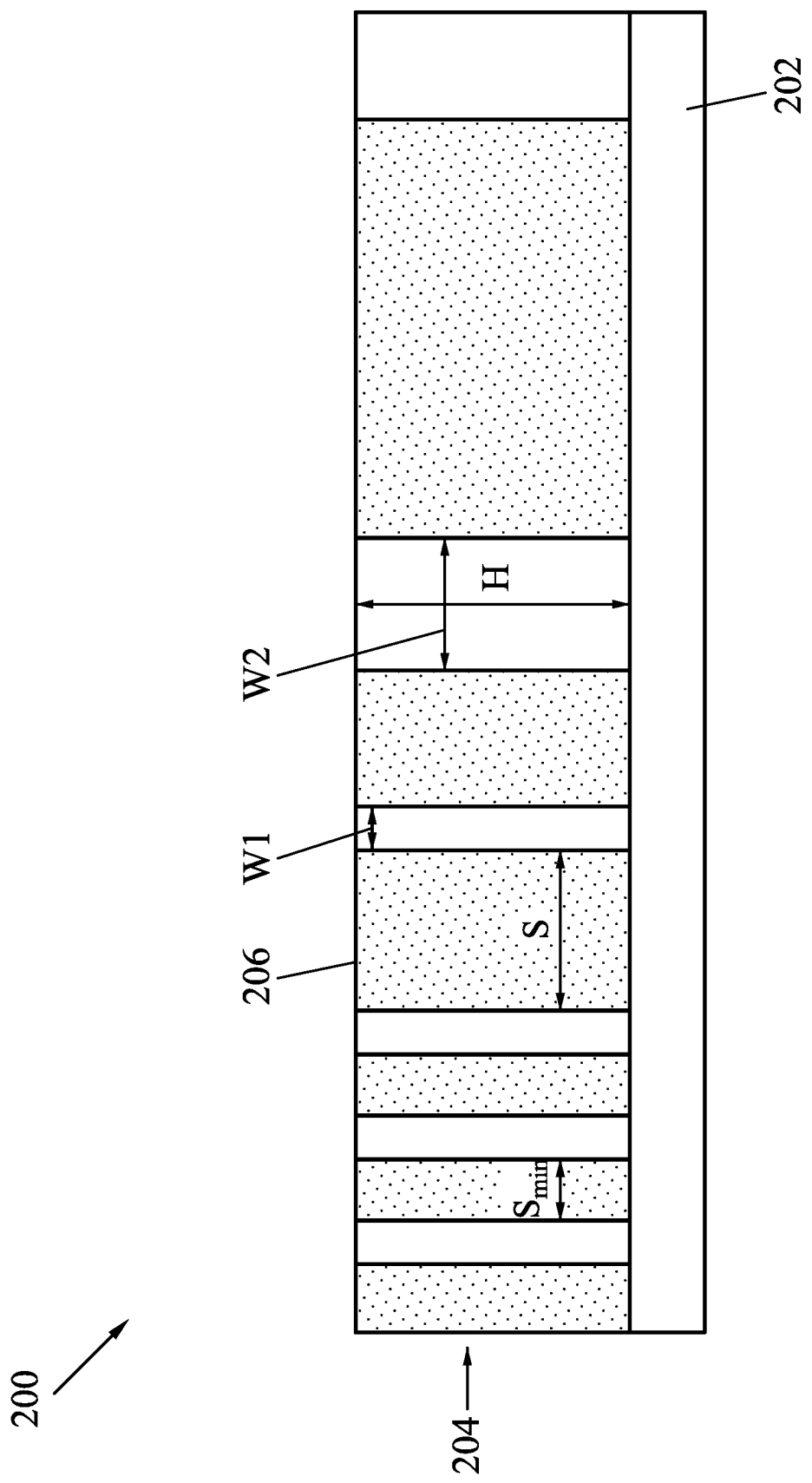
FIG. 2B illustrates a cross-section view of the device of FIG. 2A, after a CMP process, according to some embodiments.

The method 100 then proceeds to block 108 where a chemical mechanical polishing (CMP) process is performed. With reference to FIG. 2B, in an embodiment of block 108, a CMP process may be performed to remove excess material from the SND material composition 206 and planarize a top surface of the device 200. In some embodiments, after the CMP process, a top surface of the SND material composition 206 may be substantially coplanar with a top surface of the plurality of features 204 formed on the substrate 202.

The semiconductor device 200 may undergo further processing to form various features and regions known in the art. For example, subsequent processing may form gate structures, contact openings, contact metal, as well as various contacts/vias/lines and multilayer interconnect features (e.g., metal layers and interlayer dielectrics) on the substrate 202, configured to connect the various features to form a functional circuit that may include one or more multi-gate devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure.

Figure 3:
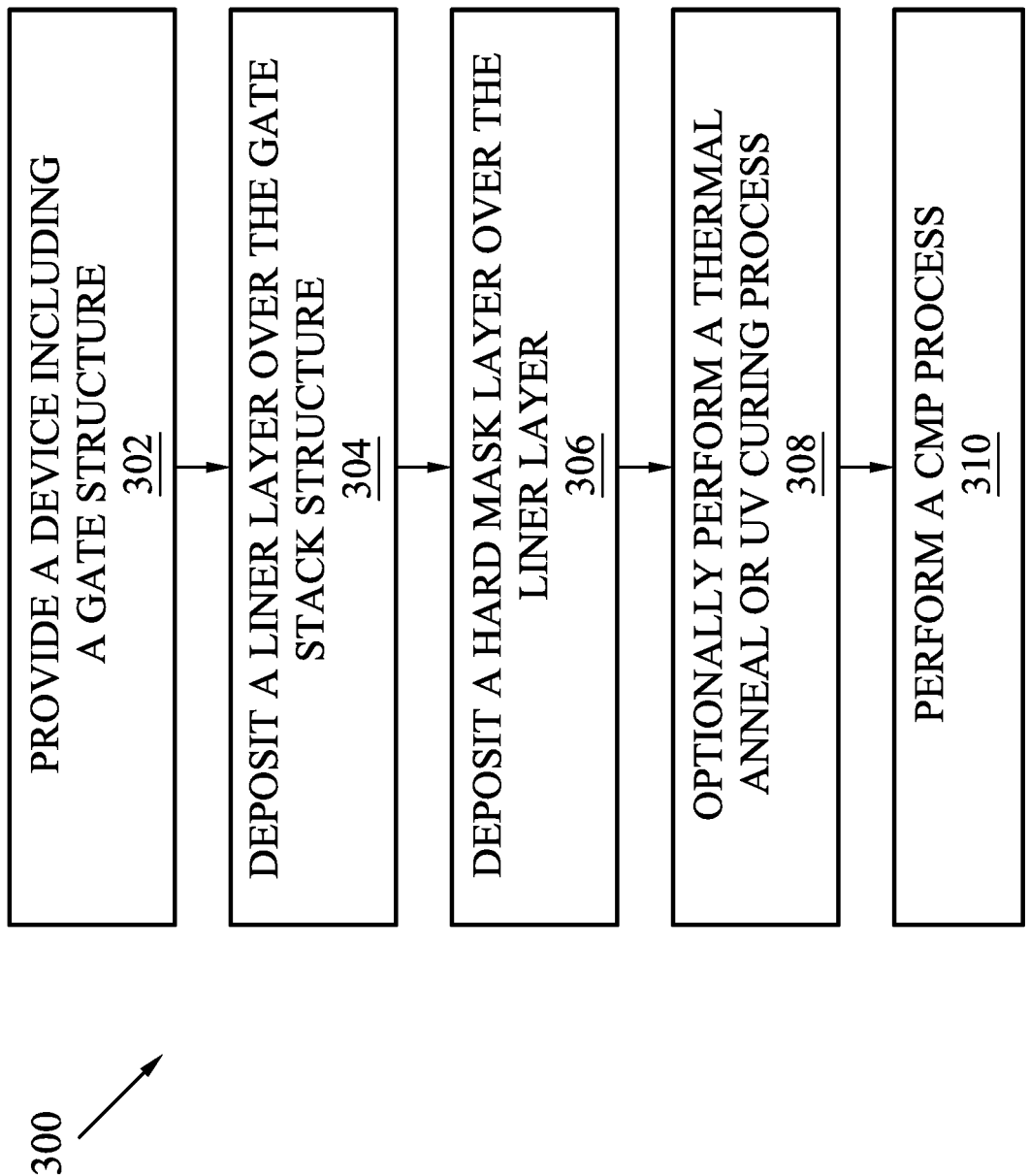
FIG. 3 shows a flow chart of a method for utilizing an SND as a hard mask, according to various embodiments.
Figure 4A:
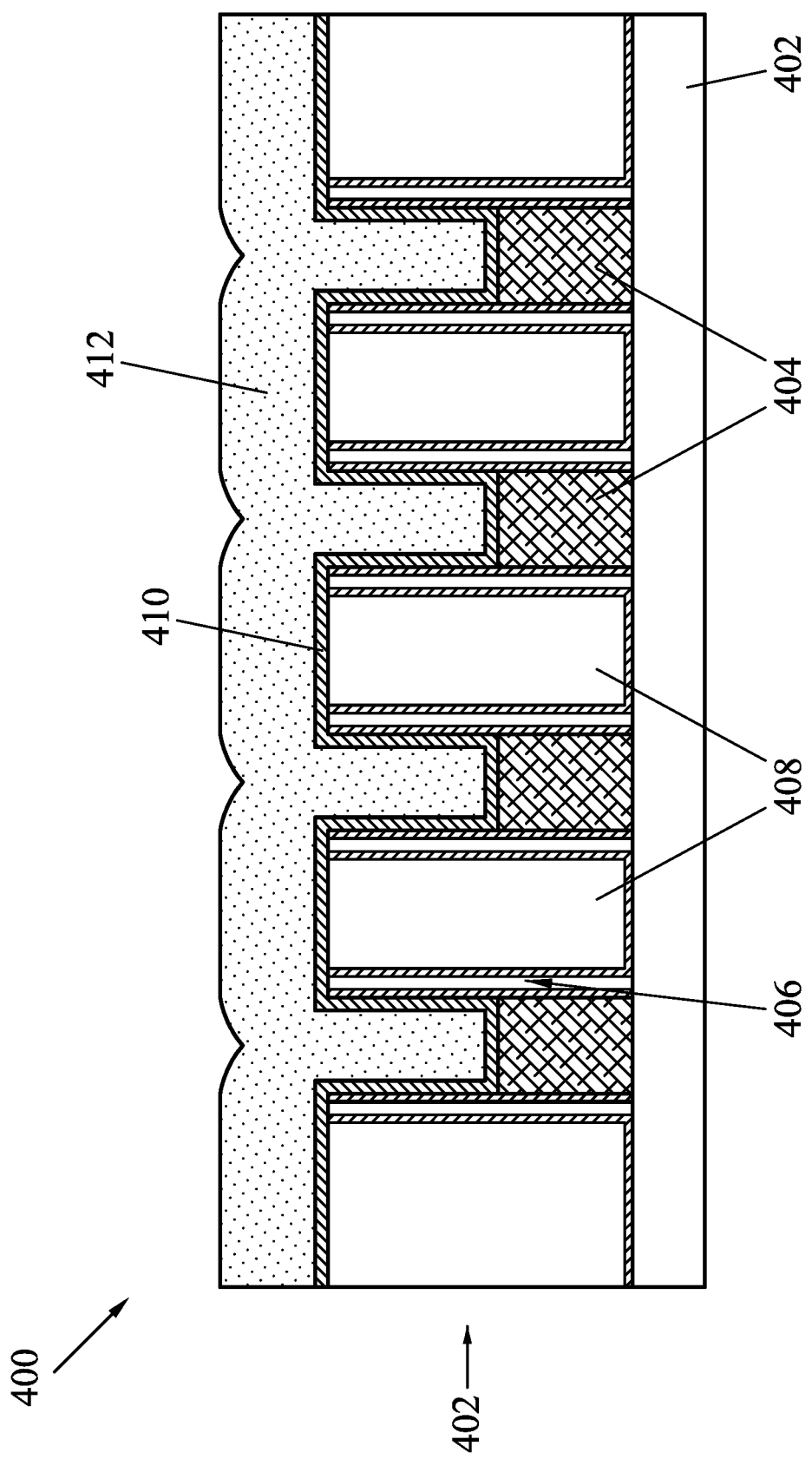
FIG. 4A illustrates a cross-section view of a device having a gate structure and an SND formed using the method of FIG. 3, according to some embodiments.

With reference now to the example of FIG. 3, illustrated therein is a flow chart of a method 300 for utilizing an SND as a hard mask, according to various embodiments. In some aspects, the method 300 is similar to the method 100. However, the method 300 provides an alternative use case for the SND. It is understood that additional operations can be provided before, during, and after the method 300, and some operations described can be replaced, eliminated, or moved around for additional embodiments of the method. It is also noted that the method 300 is exemplary, and is not intended to limit the present disclosure beyond what is explicitly recited in the claims that follow. The method 300 will be further described below in conjunction with FIGS. 4A and 4B.

The method 300 begins at block 302 where a substrate is patterned to include a gate structure. With reference to the example of FIG. 4A, in an embodiment of block 302, illustrated therein is a cross-section view of a device 400 including a substrate 402. In some embodiments, the substrate 402 may be substantially the same as the substrate 202 described above with respect to the method 100. In various examples, the device 400 further includes a plurality of gate structures 402 including a gate stack 404, one or more spacer layers 406, and a dielectric layer 408 interposing and electrically isolating adjacent gate stacks 404. In some embodiments, a channel region of a transistor (e.g., such as a FinFET) is disposed underlying the gate stacks 404. In various examples, the dielectric layer 408 includes an interlayer dielectric (ILD) layer that includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The dielectric layer 408 may be deposited by a PECVD process or other suitable deposition technique. In some embodiments, a contact etch stop layer (CESL) may be deposited prior to depositing the dielectric layer 408.

In some embodiments, the gate stacks 404 include a gate dielectric layer, and a metal layer formed over the gate dielectric layer. In some embodiments, the gate dielectric layer may include an interfacial layer formed over the channel region and a high-K dielectric layer over the interfacial layer. The interfacial layer may include a dielectric material such as silicon oxide layer ($SiO_2$) or silicon oxynitride (SiON). The high-K dielectric layer may include $HfO_2$, $TiO_2$, HfZrO, $Ta_2O_3$, $HfSiO_4$, $ZrO_2$, $ZrSiO_2$, combinations thereof, or other suitable materials. In still other embodiments, the gate dielectric layer may include silicon dioxide or another suitable dielectric. The gate dielectric layer may be formed by chemical oxidation, thermal oxidation, atomic layer deposition (ALD), physical vapor deposition (PVD), chemical vapor deposition (CVD), and/or other suitable methods. The metal layer may include a conductive layer such as W, TiN, TaN, WN, Re, Ir, Ru, Mo, Al, Cu, Co, Ni, combinations thereof, and/or other suitable compositions. In some embodiments, the metal layer may include a first group of metal materials for N-type FinFETs and a second group of metal materials for P-type FinFETs. Thus, the device 400 may include a dual work-function metal gate configuration. In some embodiments, the metal layer may alternately include a polysilicon layer. The metal layer may be formed using PVD, CVD, electron beam (e-beam) evaporation, and/or other suitable process. In some embodiments, the one or more spacer layers 406 are formed on sidewalls of the gate structures 402. The one or more spacer layers may include a dielectric material such as silicon oxide, silicon nitride, silicon carbide, silicon oxynitride, or combinations thereof. As noted, the gate structures 402 may include a high-K gate dielectric layer and a metal gate electrode. However, in some examples, the gate structures 402 include dummy gate stacks that will be replaced by a final gate stack at a subsequent processing stage of the device 400, where the final gate stack includes the high-K gate dielectric layer and the metal gate electrode.

At an intermediate stage of processing of the device 400, for example after formation of the plurality of gate structures 402, the one or more spacer layers 406, and the dielectric layer 408, a plurality of trenches or hole structures may be defined (e.g., over the gate stacks 404 and between adjacent dielectric layers 408). In some embodiments, the aspect ratio of the trenches or hole structures shown in FIG. 4A may be defined in a manner similar to that described above with reference to FIG. 2A.

The method 300 proceeds to block 304 where a liner layer is deposited within the plurality of trenches or holes overlying the gate stacks. Still referring to the example of FIG. 4A, in an embodiment of block 304, illustrated therein is a cross-section view of the device 400 including a liner layer 410 deposited on the substrate 402 and over the gate stacks 404. In some embodiments, the liner layer 410 is deposited by atomic layer deposition (ALD) such that the liner layer 410 is deposited conformally. Alternatively, in some embodiments, the liner layer 410 is deposited by PVD, CVD, or other appropriate technique. In various embodiment, the liner layer may include a nitride layer (e.g., TiN, TaN, a Si-based nitride, or other nitride layer), an oxide layer, or other appropriate layer.

The method 300 proceeds to block 306 where a hard mask layer is deposited over the liner layer. In various embodiments, the hard mask layer of the instant method includes the SND material composition disclosed herein. Still referring to the example of FIG. 4A, in an embodiment of block 306, illustrated therein is a cross-section view of the device 400 including an SND material composition 412 deposited on the substrate 402 and over the gate stacks 404. In some embodiments, the SND material composition 412 may be substantially the same as the SND material composition 206 described above with reference to the method 100.

As such, the SND material composition 412 may likewise be formed using a CVD chamber equipped with a rotary susceptor and a plasma module. Further, formation of the SND material composition 412 include various precursors (e.g., where one precursor is used as a Si and/or C source, and where the other precursor is used as an extra C source for carbon content modulation). In some embodiments, at least one of the precursors used to form the SND material composition 412 includes Si. In some embodiments, the SND material composition 412 may include an SiCON SND material composition having a Si—N—Si and a Si—O—Si network, as described above. Various other features and/or embodiments of the SND material composition 412 may be similar to those described above with reference to the material composition 206, and/or are described in more detail below with reference to FIGS. 6-18.

The method 300 proceeds to block 308 where a thermal anneal or UV curing process is optionally performed. In some cases, for example, a thermal anneal or UV curing process may be performed to the device 400 after deposition of SND material composition 412 for reduction of H content, bond cross-linking, and to increase a density of the SND material composition 412. In some embodiments, the thermal anneal or UV curing process may be performed at a temperature of about 300-450 C.

Figure 4B:
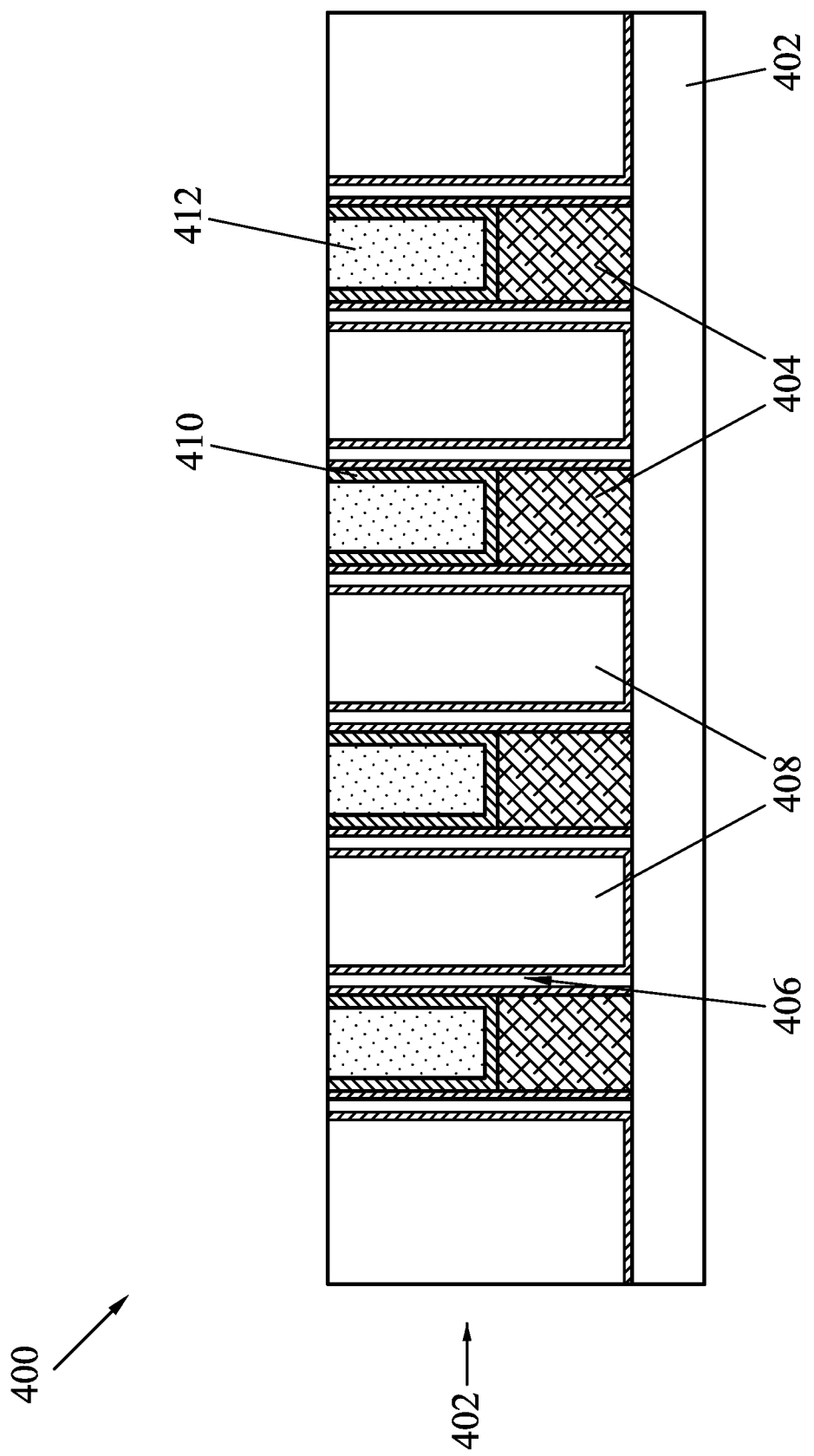
FIG. 4B illustrates a cross-section view of a device of FIG. 4A, after a CMP process, according to some embodiments.

The method 300 then proceeds to block 310 where a CMP process is performed. With reference to FIG. 4B, in an embodiment of block 310, a CMP process may be performed to remove excess material from the SND material composition 412 and planarize a top surface of the device 400. In some embodiments, the CMP process may also etch the liner layer 410 from over a top surface of the dielectric layer 408. In some cases, after the CMP process, a top surface of the SND material composition 412 may be substantially coplanar with a top surface of the dielectric layer 408.

The semiconductor device 400 may undergo further processing to form various features and regions known in the art. For example, subsequent processing may form contact openings, contact metal, as well as various contacts/vias/lines and multilayer interconnect features (e.g., metal layers and interlayer dielectrics) on the substrate 402, configured to connect the various features to form a functional circuit that may include one or more multi-gate devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure.

Various features of the SND material composition are now described in further detail. As noted above, the SND material compositions disclosed herein may be applied to form an isolation structure that contains at least one Si precursor. In some examples, the Si precursor may contain at least two Si atoms and include a Si—C—Si bonding structure. By way of example, the exemplary Si precursor may be written as a matrix bonding formula $CH_x(SiH_3)_y$, where x+y=4, and y is greater than or equal to about 2. For instance, this may include $CH_2(SiH_3)_2$, $CH(SiH_3)_3$, or $C(SiH_3)_4$, for example, corresponding to FIGS. 6, 7, and 8, respectively. In some examples, another precursor that comprises at least one Si—$CH_3$ terminal group may be defined as a C precursor which may be added (e.g., to the SND composition) to optimize the C/Si ratio of the SND composition (e.g., by C content modulation). In some embodiments, the C precursor may include methylsilane, aminosilane, or silazane, among others. In some cases, the methylsilane applied as a C precursor may be written as a matrix bonding formula $SiH_x(CH_3)_y$, where x+y=4, and y is greater than or equal to about 1. For instance, this may include $SiH_3(CH_3)$, $SiH_2(CH_3)_2$, $SiH(CH_3)_3$, or $Si(CH_3)_4$, for example, corresponding to FIGS. 9, 10, 11, and 12, respectively. In some embodiments, the aminosilane applied as a C precursor may be written as a matrix bonding formula $SiH_x(R_1)_y(R_2)_z$, where $R_1$=$CH_3$, $R_2$=$NH_2$, $NH(CH_3)$, or $N(CH_3)_2$, where x+y+z=4, and where y and z are greater than or equal to about 1. For instance, this may include $Si(CH_3)_3(NH_2)$, $Si(CH_3)_3(N(CH_3)_2)$, $SiH(CH_3)(NH(CH_3))_2$, or $Si(CH_3)_2(NH(CH_3))_2$, for example, corresponding to FIG. 13, 14, 15, or 16, respectively. In some embodiments, the silazane applied as a C precursor may be written as a matrix bonding formula $Si(NH)SiH_{2x}(CH_3)_{2y}$, where (x+y)=3, and y is greater than or equal to about 1. For instance, this may include $Si(NH)SiH_2(CH_3)_4$ corresponding to FIG. 17 and $Si(NH)Si(CH_3)_6$ corresponding to FIG. 18. While some examples of chemical structures for Si and C precursors have been given, it will be understood that other structures and other precursors may be employed without departing from the scope of the present disclosure.

Figure 20:
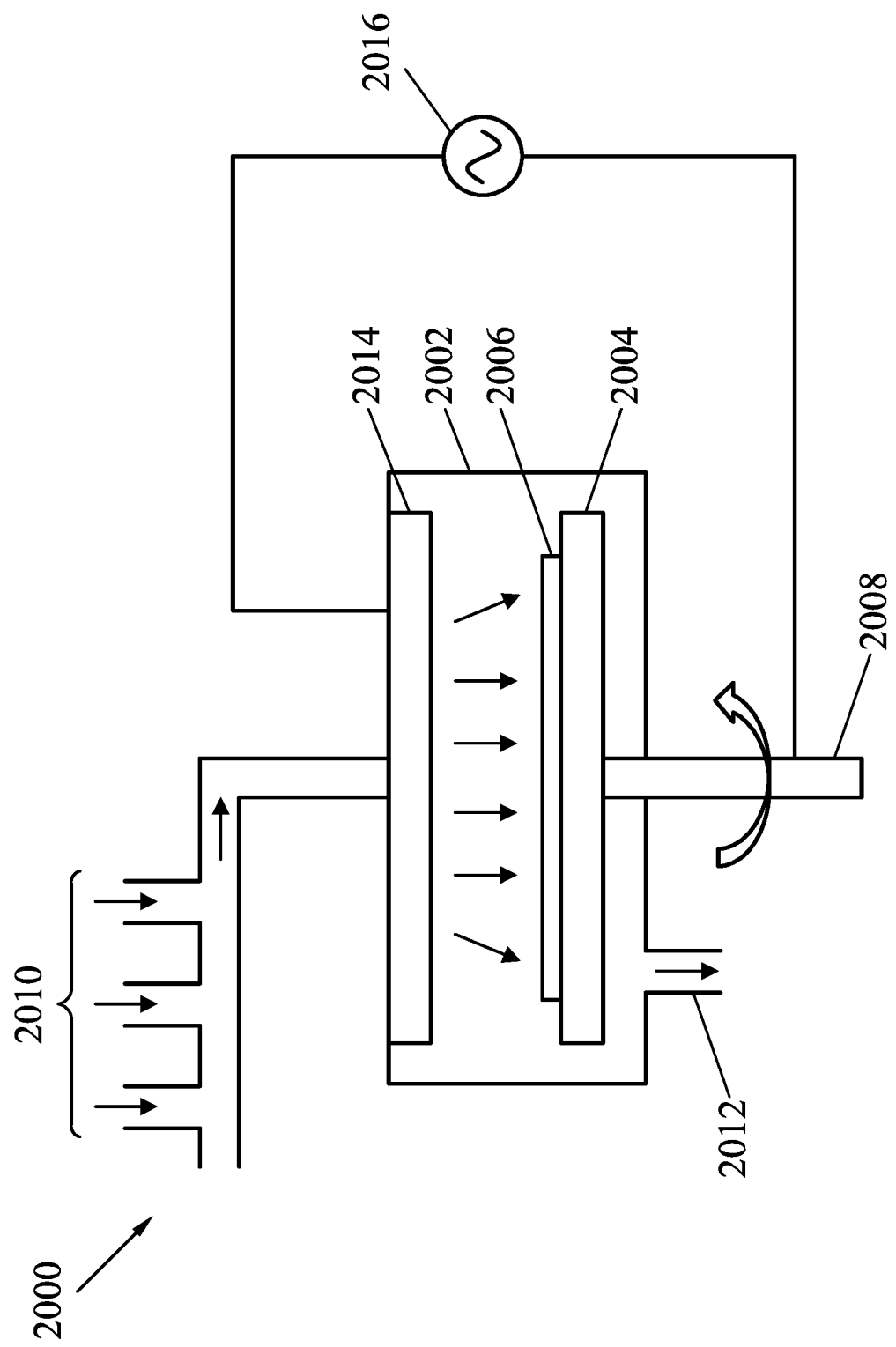
FIG. 20 shows an exemplary CVD system within which the SND may be deposited.

With reference to FIG. 20, illustrated therein is an exemplary CVD system 2000 within which the synthetic nanofill dielectrics disclosed herein may be processed. In some embodiments, the system 2000 includes a process chamber 2002 and a susceptor 2004 (upon which one or more wafers 2006 may be positioned). In some examples, the susceptor 2004 may be held in position by a rod 2008, where the rod 2008 is coupled to a drive unit, for example, to provide for rotation of the susceptor 2004 during processing. In some embodiments, the system 2000 may also include a plurality of gas injection ports 2010 (e.g., to provide various precursors, carrier gases, and/or reactant gases) and a gas exhaust port 2012. In various cases, the system 2000 may include one or more heating elements, for example, to heat the susceptor 2004, the wafers 2006, and/or the process chamber 2002. In addition, the process chamber 2002 may be fluidly coupled to a vacuum/pumping system used to maintain a vacuum condition of the process chamber 2002. In various examples, the vacuum/pumping system may include one or more of a load-lock chamber, a turbomolecular pump, a cryopump, a mechanical pump, or other appropriate vacuum/pumping system elements.

In various embodiments, the system 2000 also includes a plasma module having a shower head 2014 coupled to a power supply 2016 (e.g., such as an RF power supply) to generate a plasma within the process chamber 2002 (e.g., using one or more gases supplied via the gas injection ports 2010). In various examples, the plasma module may include an inductively coupled plasma (ICP) source, a continuous microwave plasma, a pulsed capacitively coupled plasma (CCP) generator, or a pulsed microwave plasma generator. In some embodiments, He is applied as a carrier gas and $NH_3$, $N_2$, NO, $NO_2$, $O_2$, $CO_2$, and/or $H_2$ are applied as reactant gases (e.g., via the plurality of gas injection ports 2010) for plasma formation and SND deposition. In some cases, a deposition temperature (e.g., for SND deposition on the wafer 2006) is between about 40C and about 150C. In some examples, an ICP source or a microwave plasma generator (2.45 GHz) can be applied to produce radicals for reactions within the chamber 2002.

Figure 19:
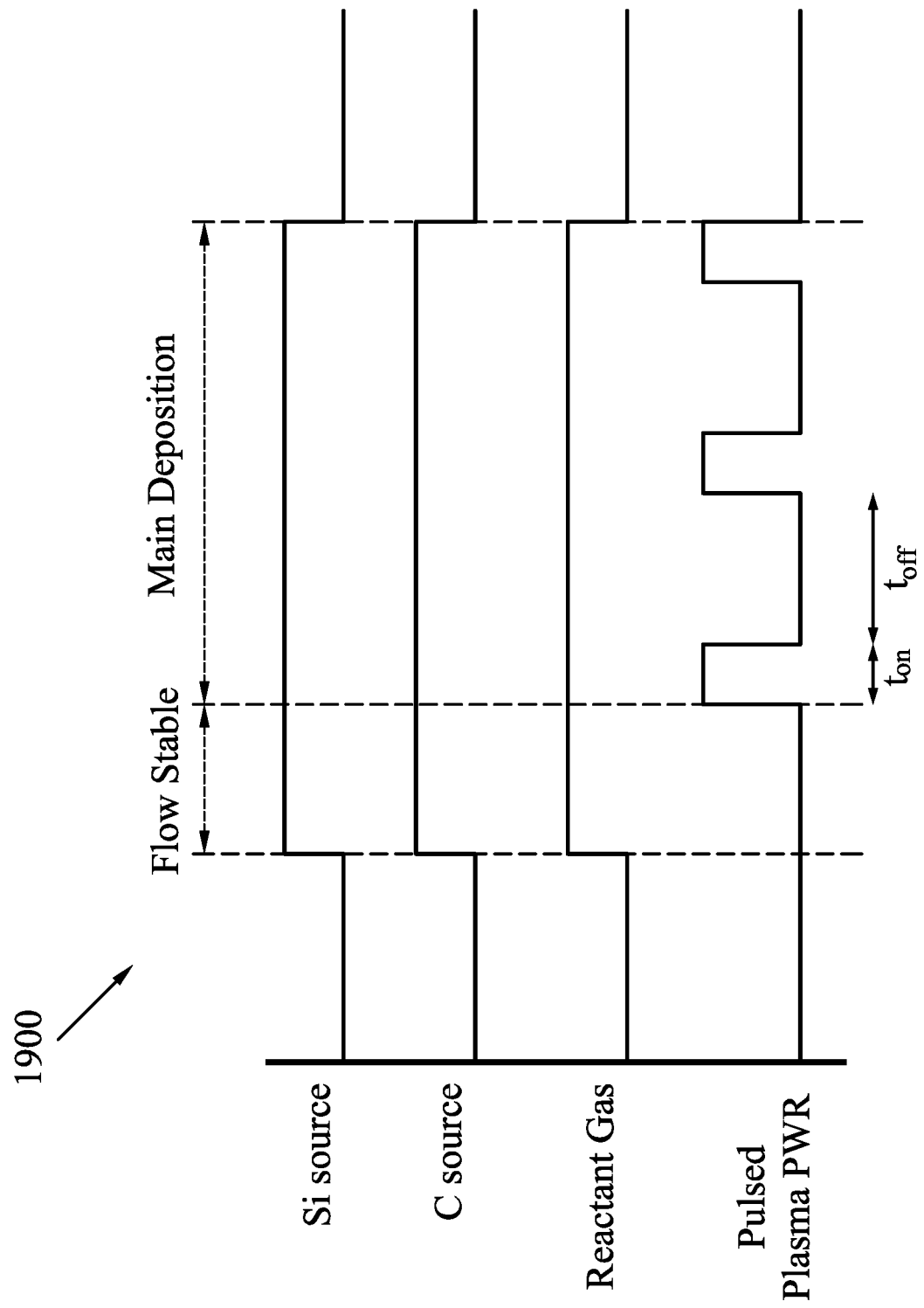
FIG. 19 illustrates a timing diagram showing an exemplary timing of Si source, a C source, a reactant gas, and a plasma power during deposition of the SND, according to some embodiments.

With reference to FIG. 19, illustrated therein is a timing diagram 1900 showing an exemplary timing of Si source, a C source, a reactant gas, and a plasma power (e.g., of a pulsed plasma module) during deposition of the SND (e.g., using the system 2000 of FIG. 20). As shown, and in various embodiments, the process of SND deposition includes a flow stable step and main deposition step, during which each of the Si source, the C source, and the reactant gas may flow into the process chamber 2002. However, in various examples, and during the flow stable step, no reaction occurs when the Si precursor and the C precursor are mixed, and no reaction occurs between the reactant gas and the precursors.

As previously noted, a plasma source (e.g., the plasma module discussed above) with a pulsed cycle period can be used during deposition of the SND. For example, a pulsed CCP plasma generator (10M-70 MHz) or pulsed microwave plasma generator may be used. In some cases, a pulsed plasma module includes a pulse-on ($t_{on}$) and a pulse-off ($t_{off}$) time period, for example, as shown in FIG. 19. In some embodiments, $t_{on}/t_{off}$ may be defined as a duty cycle of the pulsed plasma source. In some examples, $1/(t_{on}+t_{off})$ is defined as a pulse-repetition frequency (PRF) of the pulsed plasma source. In some embodiments, $t_{on}$ may have a value in a range of between μs~ms and the duty cycle may be between about 5-95%. In some embodiments, the PRF may be between about 50~100 kHz. In various cases, operation, pulsing, or modulation of the pulsed plasma source occurs during the main deposition step.

Additional aspect of various SNDs, and methods of depositing the same, are now provided. For example, in some embodiments, a SiCO SND may be fabricated by using $CH(SiH_3)_3$ as a Si source and $O_2$ as a reactant gas. In some embodiments, the processing/deposition temperature may be between about 50 C-80 C and an ICP plasma source may be used to produce O radicals for subsequent reaction. In some cases, a C precursor $SiH_2(CH_3)_2$ may be added as a co-flow with the Si precursor. In some embodiments, a post thermal anneal at a temperature between about 300 C-450 C is applied for film condensation (e.g., to reduce moisture content) and to increase the density of the SND. In the example of the SiCO SND, the SND may have a C content % equal to between about 4-18% and a density equal to between about 1.5-2.1 g/cm$^3$. In various embodiments, a dHF (100:1) etch selectivity of the SND to oxide is greater than about 10. In some embodiments, a ($NF_3$+$NH_3$) etch selectivity of the SND to oxide is greater than about 20. In some examples, the deposited SND has a dielectric constant (e.g., K value) between about 3-4.5, a leakage current density between about $10^{-9}$-$10^{-7}$ A/cm$^2$, and a breakdown field between about 3-6 MV/cm.

In some embodiments, a SiCN SND may be fabricated by using $C(SiH_3)_4$ as a Si source and $NH_3$ as a reactant gas. In some embodiments, the processing/deposition temperature is between about 75 C-110 C and a microwave plasma generator is applied to produce $NH_3$ radicals for subsequent reaction. In various cases, a C precursor including $Si(CH_3)_3(N(CH_3)_2)$ may be added and as a co-flow with the Si precursor. In some embodiments, a post UV cure process at a temperature equal to between about 300 C-450 C may be applied for H content reduction and film condensation. In some cases, the SiCN SND may have a C content % equal to between about 3-10% and a density equal to between about 1.7-2.4 $g/cm^3$. In some embodiments, a dHF (100:1) etch selectivity of the SND to oxide is greater than about 10. In some embodiments, an $H_3PO_4$ etch selectivity of the SND to SiN is greater than about 5. In some cases, a $CH_xF_y+O_2$ plasma dry etch selectivity of the SND to SiN is greater than about 1.5.

In some examples, a SiCON SND may be fabricated by using $C(SiH_3)_4$ as a Si source and $NH_3/O_2$ as reactant gases. In various cases, the $NH_3/O_2$ ratio is equal to between about 0.2-0.5. In some embodiments, the processing/deposition temperature is between about 60 C-100 C and a pulsed microwave plasma generator may be used to produce $NH_3$ and $O_2$ radicals for subsequent reaction. In some cases, the $t_{on}$ (e.g., FIG. 19) is equal to between about 100 us-1 ms and the duty cycle is equal to between about 40-70%. In some embodiments, a C precursor including $Si(NH)SiH_2(CH_3)_4$ may be added and as a co-flow with the Si precursor. In some examples, a thermal anneal process is performed at a temperature equal to between about 300 C-450 C for H content reduction film and film condensation. In some embodiments, the SiCON SND has a C content % equal to between about 8-18%, a nitrogen/oxygen (N/O) ratio equal to between about 0.3-0.7, and a density equal to between about 1.9-2.4 $g/cm^3$. In various embodiments, the dielectric constant (e.g., K value) of the SND is equal to between about 4.5-5.5, the leakage current density is equal to between about $10^{-10}$-$10^{-8}$ $A/cm^2$, and a breakdown field is equal to between about 4-6 MV/cm. In some cases, a dHF (100:1) etch selectivity of the SND to oxide is greater than about 10. In some embodiments, a $(NF_3+NH_3)$ etch selectivity of the SND to oxide is greater than about 20. By way of example, a $Cl_2$-based etch selectivity of the SND to Si is greater than about 12. In some embodiments, a $(CH_xF_y+O_2)$ plasma dry etch selectivity of the SND to SiN and SiO is greater than about 4.

The embodiments of the present disclosure offer advantages over existing art, though it is understood that other embodiments may offer different advantages, not all advantages are necessarily discussed herein, and that no particular advantage is required for all embodiments. For example, embodiments discussed herein include a dielectric material composition and related methods that effectively mitigate shortcomings of at least some existing methods. In some embodiments, an SND is employed to form a dielectric layer. In some examples, the SND may be used as a gap-fill material, as a hard mask material, or generally as a dielectric material layer. In some embodiments, the SND material may be formed using a CVD chamber equipped with a rotary susceptor and a plasma module. In some embodiments, formation of the SND material includes use of one or two precursors, where one precursor is used as a Si and/or C source, and where the other precursor is used as an extra C source for carbon content modulation. In some examples, modulation of the C content provides for etch selectivity tuning. In some embodiments, at least one of the precursors used to form the SND material includes Si. Generally, in various embodiments, the present disclosure provides for the formation of a carbon-containing nanofill material with excellent flowability and chemical selectivity. Those of skill in the art will readily appreciate that the methods described herein may be applied to a variety of other semiconductor structures, semiconductor devices, and semiconductor processes to advantageously achieve similar benefits to those described herein without departing from the scope of the present disclosure.

Thus, one of the embodiments of the present disclosure described a method including patterning a substrate to include a first feature, a second feature adjacent to the first feature, and a trench disposed between the first and second features. The method further includes depositing a dielectric material over the first feature and within the trench. In some embodiments, the depositing the dielectric material includes flowing a first precursor, a second precursor, and a reactant gas into a process chamber. Further, while flowing the first precursor, the second precursor, and the reactant gas into the process chamber, a plasma is formed within the process chamber to deposit the dielectric material.

In another of the embodiments, discussed is a method including providing a substrate including a trench, depositing a liner layer conformally within the trench, and forming an isolation structure over the liner layer within the trench. In some embodiments, the isolation structure includes one of SiCON, SiCN, and SiCO. In various examples, the forming the isolation structure includes flowing a Si precursor and a C precursor into a process chamber. While flowing the Si precursor and the C precursor into the process chamber, in some embodiments, a power of a plasma source is pulsed to form the isolation structure.

In yet other embodiments, discussed is a method including providing a gate structure over a substrate, where a channel region is disposed underlying the gate structure. The method further includes forming a trench over the gate structure and depositing a mask layer within the trench. The mask layer is deposited in a chemical vapor deposition (CVD) process chamber including a plasma module. In some embodiments, the depositing the mask layer includes flowing a Si precursor and a C precursor into CVD process chamber.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   patterning a substrate to include a first feature, a second feature adjacent to the first feature, and a trench disposed between the first and second features; and
   depositing a dielectric material over the first feature and within the trench, wherein the depositing the dielectric material comprises:
      simultaneously flowing a first precursor, a second precursor, and a reactant gas into a process chamber, as part of a flow stable deposition step, during which no reaction occurs between the reactant gas and the first and second precursors, wherein the first precursor is a Si precursor having a first matrix bonding formula equal to $C(SiH_3)_4$ and wherein the second precursor is a C precursor having a second matrix bonding formula equal to $Si(NH)SiH_2(CH_3)_4$; and
      while simultaneously flowing the first precursor, the second precursor, and the reactant gas into the process chamber, as part of a main deposition step after the flow stable deposition step, forming a plasma within the process chamber to deposit the dielectric material.

2. The method of claim 1, wherein the reactant gas includes at least one of $NH_3$, $N_2$, NO, $NO_2$, $O_2$, $CO_2$, and $H_2$.

3. The method of claim 1, wherein the dielectric material has a composition including a network of Si—N—Si bonds and Si—O—Si bonds.

4. The method of claim 1, wherein the Si precursor includes a Si—C—Si bonding structure, and wherein the C precursor includes a Si—$CH_3$ terminal group.

5. The method of claim 1, wherein the C precursor further includes methylsilane, aminosilane, or silazane.

6. The method of claim 1, wherein the reactant gas includes both $NH_3$ and $O_2$.

7. The method of claim 1, wherein the dielectric material includes one of SiCON, SiCN, and SiCO.

8. The method of claim 1, wherein the forming the plasma includes pulsing a power of a plasma source during the main deposition step.

9. The method of claim 8, wherein the pulsing the power of the plasma source includes pulsing the power of the plasma source at a pulse-repetition frequency (PRF) between 50-100 kHz.

10. A method, comprising:
providing a substrate including a trench;
depositing a liner layer conformally within the trench; and
forming an isolation structure over the liner layer within the trench, wherein the isolation structure includes one of SiCON, SiCN, and SiCO, and wherein the forming the isolation structure comprises:
concurrently flowing a Si precursor, a C precursor, and a reactant gas into a process chamber, wherein the Si precursor includes $C(SiH_3)_4$, wherein the C precursor includes $Si(NH)SiH_2(CH_3)_4$, and wherein the reactant gas includes both $NH_3$ and $O_2$;
while flowing the Si precursor, the C precursor, and the reactant gas into the process chamber, and during a flow stable step, there is no reaction within the process chamber between one of the Si precursor, the C precursor, and the reactant gas and another of the Si precursor, the C precursor, and the reactant gas; and
while flowing the Si precursor, the C precursor, and the reactant gas into the process chamber, and during a main deposition step after the flow stable step, forming a plasma within the process chamber to form the isolation structure.

11. The method of claim 10, wherein the forming the isolation structure includes depositing a first thickness of the isolation structure within the trench and depositing a second thickness of the isolation structure over the first feature, and wherein a ratio of the first thickness to the second thickness is greater than five.

12. The method of claim 10, further comprising:
after forming the isolation structure, performing an annealing process at a temperature of between 300C-450C to reduce a H content of the isolation structure and to increase a density of the isolation structure.

13. The method of claim 10, wherein the forming the isolation structure is performed at a temperature of between 40C and 150C.

14. The method of claim 10, wherein a spacing between the first feature and the second feature is greater than or equal to 6 nm, wherein a width of each of the first feature and the second feature is greater than or equal to 6 nm and less than or equal to 50 nm, and wherein a height of the first feature and the second feature is greater than or equal to 48 nm and less than or equal to 150 nm.

15. The method of claim 10, wherein the forming the plasma includes pulsing a power of a plasma source during the main deposition step.

16. The method of claim 15, wherein the plasma source includes an inductively coupled plasma (ICP) source, a continuous microwave plasma, a pulsed capacitively coupled plasma (CCP) generator, or a pulsed microwave plasma generator.

17. A method, comprising:
providing a gate structure over a substrate, wherein a channel region is disposed underlying the gate structure;
forming a trench over the gate structure; and
depositing a mask layer within the trench, wherein the mask layer is deposited in a chemical vapor deposition (CVD) process chamber including a plasma module, wherein the depositing the mask layer includes flowing a Si precursor and a C precursor into the CVD process chamber; wherein the Si precursor includes $C(SiH_3)_4$, and wherein the C precursor includes $Si(NH)SiH_2(CH_3)_4$.

18. The method of claim 17, further comprising:
prior to depositing the mask layer, depositing a liner layer within the trench, and depositing the mask layer over the liner layer.

19. The method of claim 17, further comprising:
after depositing the mask layer, annealing the mask layer, and performing a chemical mechanical polishing (CMP) process to planarize a top surface of the gate structure.

20. The method of claim 17, wherein the mask layer includes one of SiCON, SiCN, and SiCO.

* * * * *